United States Patent
Yoshii et al.

(10) Patent No.: US 10,938,370 B2
(45) Date of Patent: Mar. 2, 2021

(54) PIEZOELECTRIC RESONATOR UNIT, MODULE COMPONENT, AND MANUFACTURING METHOD FOR SAME

(71) Applicant: Murata Manufacturing Co., Ltd., Nagaokakyo (JP)

(72) Inventors: Kentaro Yoshii, Nagaokakyo (JP); Hiroaki Kaida, Nagaokakyo (JP); Takashi Saeki, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 522 days.

(21) Appl. No.: 15/823,873

(22) Filed: Nov. 28, 2017

(65) Prior Publication Data
US 2018/0167050 A1 Jun. 14, 2018

(30) Foreign Application Priority Data
Dec. 12, 2016 (JP) .............................. JP2016-240187

(51) Int. Cl.
| H03H 9/02 | (2006.01) |
| H03H 9/10 | (2006.01) |
| H03H 3/02 | (2006.01) |
| H03H 9/19 | (2006.01) |
| H03H 9/17 | (2006.01) |

(52) U.S. Cl.
CPC .......... H03H 9/02023 (2013.01); H03H 3/02 (2013.01); H03H 9/1021 (2013.01); H03H 9/19 (2013.01); H03H 9/174 (2013.01)

(58) Field of Classification Search
CPC .......... H01L 41/053; H03H 9/15; H03H 9/17; H03H 9/19; H03H 9/02157

USPC ........................................................ 310/348
See application file for complete search history.

(56) References Cited

U.S. PATENT DOCUMENTS

| 6,489,558 B1 * | 12/2002 | Baba | ................... H01L 21/4803 174/523 |
| 8,314,485 B2 | 11/2012 | Ono | |
| 9,548,437 B2 | 1/2017 | Ohashi | |
| 2004/0100164 A1 | 5/2004 | Murata et al. | |
| 2010/0200983 A1 | 8/2010 | Ono | |
| 2011/0109394 A1 * | 5/2011 | Sato | ..................... H03H 9/1014 331/68 |
| 2014/0191617 A1 * | 7/2014 | Ohashi | ................ H01L 41/0533 310/348 |
| 2015/0155849 A1 | 6/2015 | Kikuchi | |

FOREIGN PATENT DOCUMENTS

| JP | H08115992 A | 5/1996 |
| JP | 2003-87071 A | 3/2003 |
| JP | 2005124122 A | 5/2005 |

(Continued)

*Primary Examiner* — Derek J Rosenau
(74) *Attorney, Agent, or Firm* — Arent Fox LLP

(57) ABSTRACT

A piezoelectric resonator unit that includes a base, a piezoelectric resonator mounted on the base member, and a cover that is bonded to the base and that collectively forms an inner space that accommodates the piezoelectric resonator. The cover includes a top surface that faces the base with the piezoelectric resonator interposed therebetween, and a side wall that extends in a direction that intersects a main surface of the top surface. The piezoelectric resonator unit is designed so that the thickness of the top surface is larger than the thickness of the side wall.

16 Claims, 6 Drawing Sheets

(56) References Cited

FOREIGN PATENT DOCUMENTS

| | | |
|---|---|---|
| JP | 2009038285 A | 2/2009 |
| JP | 2010016030 A | 1/2010 |
| JP | 2010-245933 A | 10/2010 |
| JP | 2013090228 A | 5/2013 |
| JP | 2015128276 A | 7/2015 |
| KR | 10-2016-0012412 A | 2/2016 |
| WO | 2013027760 A1 | 2/2013 |

* cited by examiner

PIEZOELECTRIC RESONATOR UNIT, MODULE COMPONENT, AND MANUFACTURING METHOD FOR SAME

CROSS REFERENCE TO RELATED APPLICATIONS

The present application claims priority to Japanese Patent Application No. JP 2016-240187, filed Dec. 12, 2016, the entire contents of which are incorporated herein by reference.

TECHNICAL FIELD

The present disclosure relates to a piezoelectric resonator unit, a module component, and a manufacturing method for the same.

BACKGROUND

Currently, quartz crystal resonator units composed of synthetic quartz crystals are widely used in signal sources of reference signals used by oscillation devices, bandpass filters, and so forth. For example, Japanese Unexamined Patent Application Publication No. 2010-245933 discloses a quartz crystal resonator unit that is constituted by a flat-plate-shaped base member, a concave-shaped cover member, and a quartz crystal resonator that is accommodated in an inner space that is formed when the base member and the cover member are bonded to each other. The pressure of the inner space formed by the base member and the cover member is reduced in order to realize an effect of stabilizing the frequency of the quartz crystal resonator unit, for example.

In such a design, the quartz crystal resonator unit may be covered by a resin sealing member in order to make the mounting posture of the quartz crystal resonator unit stable when the quartz crystal resonator unit is mounted on a circuit board and in order to protect the quartz crystal resonator unit from falls and damage. However, the sealing member contracts and causes the cover member to deform when the sealing member is cured. Consequently, there is a problem in that stress is concentrated in a bonding portion between the base member and the cover member. As a result, a crack may be generated due to such concentration of stress. When a crack is generated in this way, the crack may cause variations to occur in the frequency of the resonator unit if the air pressure of the inner space of the quartz crystal resonator unit changes as a result of the air tightness of the inner space of the quartz crystal resonator unit being reduced.

SUMMARY OF THE INVENTION

The present disclosure addresses the above-described circumstances of such conventional designs. Thus, it is an object thereof to provide a piezoelectric resonator unit that can reduce stress generated in a bonding portion between a base member and a cover member, to provide a module component, and to provide a manufacturing method for the same.

In one example, a piezoelectric resonator unit is disclosed that includes a base member; a piezoelectric resonator that is mounted on the base member; and a cover member that is bonded to the base member, and that forms, together with the base member, an inner space that accommodates the piezoelectric resonator. Moreover, the cover member includes a top surface portion that faces the base member with the piezoelectric resonator interposed therebetween, and a side wall portion that extends in a direction that intersects a main surface of the top surface portion. In the exemplary embodiment, the thickness of the top surface portion is larger than the thickness of the side surface portion.

According to this exemplary embodiment, the stress that acts on a bonding portion between the base member and the cover member when an external force acts on the cover member can be reduced through deformation of the side wall portion of the cover member. Thus, the air-tightness of the inner space can be maintained and reduction of the airtight property of the piezoelectric resonator unit can be suppressed by suppressing the generation of cracks in the bonding portion.

Moreover, a method for manufacturing a piezoelectric resonator unit is also disclosed that includes a step of providing a cover member that includes a top surface portion and a side wall portion that extends in a direction that intersects a main surface of the top surface portion by press working a substantially flat plate shaped metal member; a step of mounting a piezoelectric resonator on a base member; and a step of bonding the cover member to the base member and accommodating the piezoelectric resonator in an inner space formed by the base member and the cover member. In this exemplary embodiment, a thickness of the top surface portion is larger than a thickness of the side surface portion.

According to this exemplary embodiment, the tensile stress that acts on a bonding portion between the base member and the cover member when an external force acts on the cover member can be reduced through deformation of the side wall portion of the cover member. Thus, the air-tightness of the inner space can be maintained and reduction of the airtight property of the piezoelectric resonator unit can be suppressed by reducing the generation of cracks in the bonding portion.

According to preferred embodiments of the present disclosure, a piezoelectric resonator unit is provided that reduces stress generated in a bonding portion between a base member and a cover member thereof, a module component, and a manufacturing method for the same.

Other features, elements, characteristics and advantages of the present disclosure will become more apparent from the following detailed description of preferred embodiments with reference to the attached drawings.

DETAILED DESCRIPTION OF THE EXEMPLARY EMBODIMENTS

Hereafter, embodiments of the present disclosure are described. In the following description of the drawings, identical or similar constituent elements are denoted by identical or similar symbols. The drawings are exemplary, the dimensions and shapes of the various parts are schematic, and it should be understood that the technical scope of the disclosed invention is not limited to these embodiments.

Furthermore, in the following description, a quartz crystal resonator unit that includes a quartz crystal resonator is described as an example of a piezoelectric resonator unit. The quartz crystal resonator utilizes a quartz crystal blank as a piezoelectric body that vibrates in accordance with an applied voltage. However, a piezoelectric resonator unit according to an exemplary embodiment is not limited to a quartz crystal resonator unit, and another type of piezoelectric body such as a ceramic body may be utilized.

Figure 1:
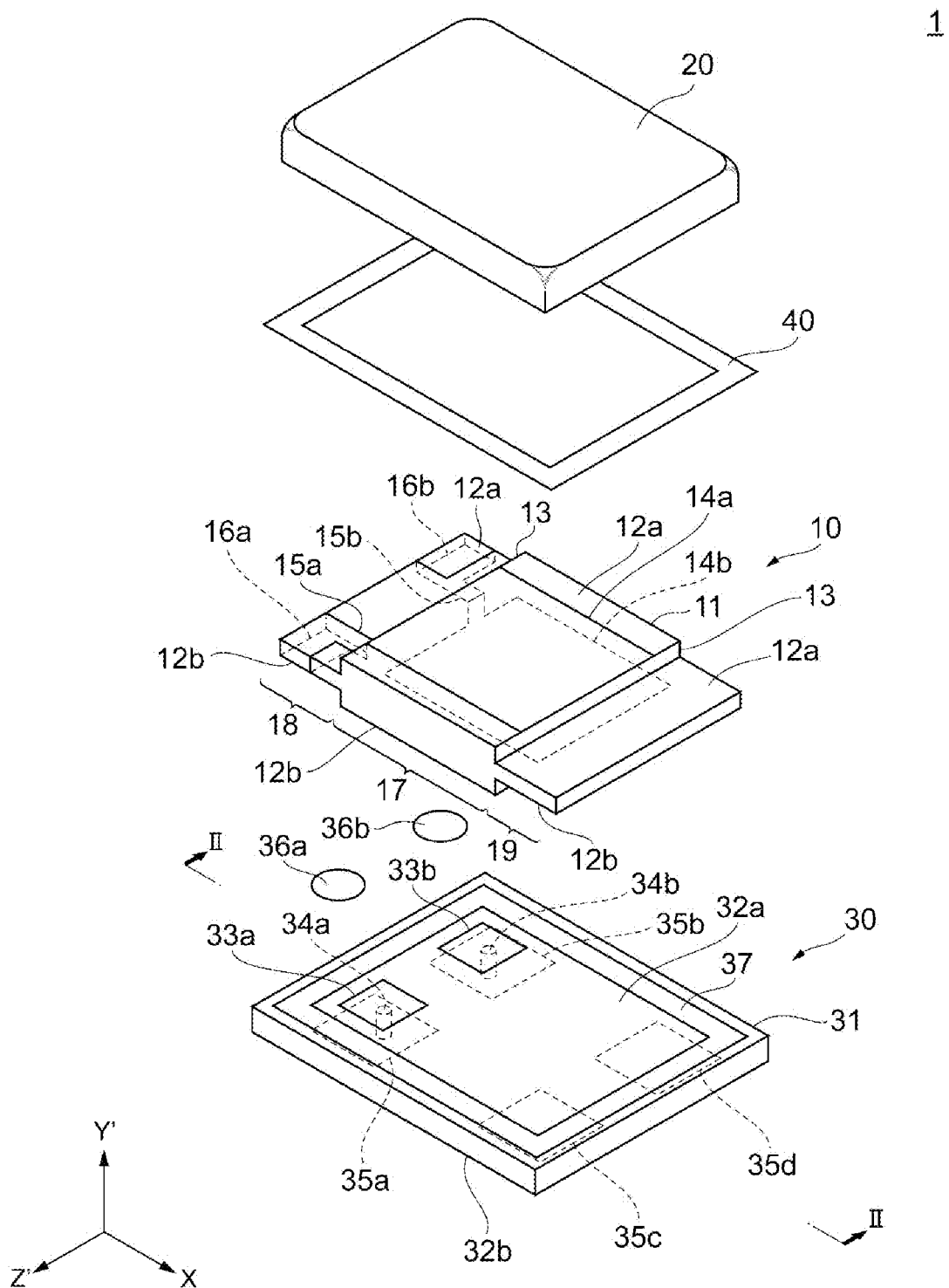
FIG. 1 is an exploded perspective view of a quartz crystal resonator unit according to an exemplary embodiment.
Figure 2:
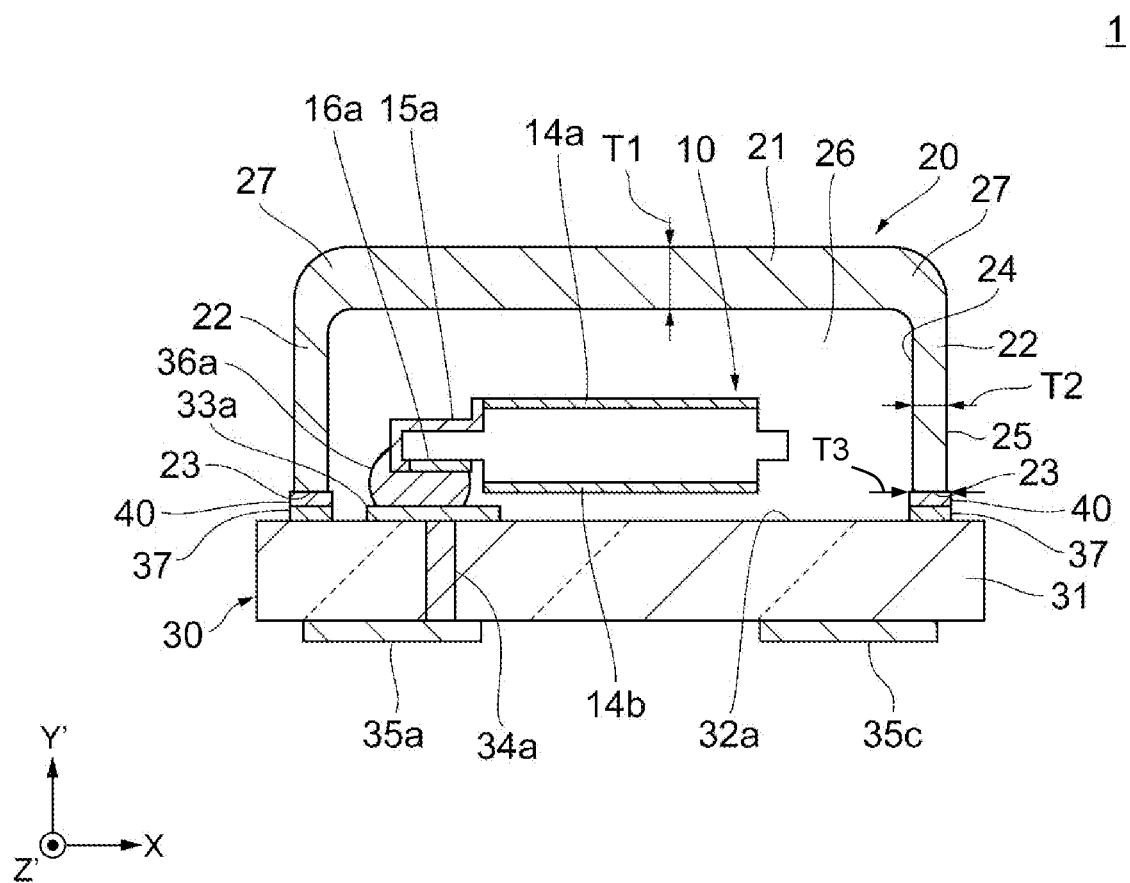
FIG. 2 is a sectional view of the quartz crystal resonator unit illustrated in FIG. 1 taken along line II-II in FIG. 1.

A quartz crystal resonator unit according to an exemplary embodiment will be described while referring to FIGS. 1 and 2. FIG. 1 is an exploded perspective view of a quartz crystal resonator unit according to the exemplary embodiment. FIG. 2 is a sectional view of the quartz crystal resonator unit illustrated in FIG. 1 taken along line II-II in FIG. 1.

As illustrated in FIG. 1, a quartz crystal resonator unit 1 according to this embodiment includes a quartz crystal resonator 10, a cover member 20 or "cover" (the terms are used interchangeably) and a base member 30 or "base" (the terms are used interchangeably). The base member 30 and the cover member 20 form a retainer that is for accommodating the quartz crystal resonator 10. For example, the cover member 20 has a substantially concave shape, and specifically has a substantially box-like shape having an opening, and the base member 30 is substantially flat plate shaped. Provided that the cover member 20 has a concave shape, the shape of the base member 30 is not particularly limited, and the base member 30 may be substantially flat plate shaped or have a substantially concave shape with respect to the cover member 20.

According to the exemplary embodiment, the quartz crystal resonator 10 includes a substantially sheet-shaped quartz crystal blank 11. As shown, the quartz crystal blank 11 has a first main surface 12a and a second main surface 12b, which are opposite each other. Preferably, the quartz crystal blank 11 is an AT-cut quartz crystal blank, for example. An AT-cut quartz crystal blank is a quartz crystal blank that is obtained by cutting an synthetic quartz crystal such that a plane parallel to a plane specified by an X axis and a Z' axis (hereafter, referred to as an "XZ' plane". Applies in a similar manner for planes defined by other axes) becomes a main plane of the quartz crystal blank. In addition, the X axis, a Y axis and a Z axis are crystallographic axes of an synthetic quartz crystal, and a Y' axis and a Z' axis are axes that are respectively obtained by rotating the Y axis and the Z axis by 35° 15'±1'30" around the X axis in a direction from the Y axis toward the Z axis. In other words, the first main surface 12a and the second main surface 12b of the AT-cut quartz crystal blank 11 correspond to the XZ' plane. It should be appreciated that a cut other than an AT cut (for example, a BT cut) may be used for the cut angle of the quartz crystal blank.

The AT-cut quartz crystal blank 11 has a long side direction in which long sides thereof that are parallel to the X axis direction extend, a short side direction in which short sides thereof that are parallel to the Z' axis direction extend, and a thickness direction in which a thickness dimension thereof that is parallel to the Y' axis direction extends. The quartz crystal blank 11 has a substantially rectangular shape when seen in plan view from a direction normal to the first main surface 12a, and has in the center thereof an excitation portion 17 that contributes to excitation, a peripheral portion 18 that is adjacent to the excitation portion 17 on the negative direction side of the X axis and a peripheral portion 19 that is adjacent to the excitation portion 17 on the positive direction side of the X axis.

As further shown, a step 13 is provided between the excitation portion 17 and the peripheral portion 19. Preferably, the quartz crystal blank 11 has a mesa structure in which the excitation portion 17 is thicker than the peripheral portions 18 and 19. However, the quartz crystal blank 11 is not limited to this shape, and for example, may be substantially comb-tooth-shaped when seen in plan view from a direction normal to the first main surface 12a. In addition, the quartz crystal blank 11 may have a flat plate structure in which the thickness thereof is substantially uniform in the X axis direction and the Z' axis direction, or may have a reverse mesa structure in which the excitation portion 17 is thinner than the peripheral portions 18 and 19. Furthermore, the quartz crystal blank 11 may have a convex shape or a beveled shape in which the thicknesses of the excitation portion 17 and the peripheral portions 18 and 19 change in a continuous manner.

In general, quartz crystal resonators that use an AT-cut quartz crystal blank exhibit high frequency stability over a wide range of temperatures, have excellent aging characteristics and can be manufactured at low cost. In addition, AT-cut quartz crystal resonators use a thickness shear vibration mode as a main vibration.

The quartz crystal resonator 10 has a first excitation electrode 14a and a second excitation electrode 14b, which constitute a pair of electrodes. The first excitation electrode 14a is provided on the first main surface 12a of the excitation portion 17. Furthermore, the second excitation electrode 14b is provided on the second main surface 12b of the excitation portion 17. The first excitation electrode 14a and the second excitation electrode 14b are provided so as to face each other with the quartz crystal blank 11 interposed therebetween. The first excitation electrode 14a and the second excitation electrode 14b are arranged so as to be substantially superposed with each other in the XZ' plane.

The first excitation electrode 14a and the second excitation electrode 14b each have long sides that are parallel to the X axis direction, short sides that are parallel to the Z' axis direction, and a thickness dimension that is parallel to the Y' axis direction. In the example illustrated in FIG. 1, the long sides of the first excitation electrode 14a and the second excitation electrode 14b are parallel to the long sides of the quartz crystal blank 11, and the short sides of the first excitation electrode 14a and the second excitation electrode 14b are parallel to the short sides of the quartz crystal blank 11 in the XZ' plane. In addition, the long sides of the first excitation electrode 14a and the second excitation electrode 14b are spaced apart from the long sides of the quartz crystal blank 11, and the short sides of the first excitation electrode 14a and the second excitation electrode 14b are spaced apart from the short sides of the quartz crystal blank 11.

The quartz crystal resonator 10 has a pair of extension electrodes 15a and 15b and a pair of connection electrodes 16a and 16b. The connection electrode 16a is electrically connected to the first excitation electrode 14a via the extension electrode 15a. The connection electrode 16b is electrically connected to the second excitation electrode 14b via the extension electrode 15b. The connection electrodes 16a and 16b are terminals for electrically connecting the first excitation electrode 14a and the second excitation electrode 14b to the base member 30. The quartz crystal resonator 10 is held on the base member 30. The first main surface 12a of the quartz crystal blank 11 is located on the opposite side from the side that faces the base member 30, and the second main surface 12b of the quartz crystal blank 11 is located on the side that faces the base member 30.

The extension electrode 15a is provided on the first main surface 12a, and the extension electrode 15b is provided on the second main surface 12b. The connection electrode 16a is provided so as to extend from the first main surface 12a of the peripheral portion 18 to the second main surface 12b of the peripheral portion 18, and the connection electrode 16b is provided so as to extend from the second main surface 12b of the peripheral portion 18 to the first main surface 12a of the peripheral portion 18. The first excitation electrode 14a, the extension electrode 15a and the connection electrode 16a are continuous with each other, and the second excitation electrode 14b, the extension electrode 15b and the connection electrode 16b are continuous with each other.

In the example configuration illustrated in FIG. 1, a cantilever structure is provided in which the connection electrode 16a and the connection electrode 16b are arrayed with respect to each other in the short side direction (Z' axis direction) of the quartz crystal blank 11, and the quartz crystal resonator 10 is held at one short side thereof. Alternatively, a double-sided support structure may instead be adopted in which the quartz crystal resonator 10 is held at both short sides thereof, and in this case, one out of the connection electrode 16a and the connection electrode 16b is provided on the peripheral portion 18 and the other out of the connection electrode 16a and the connection electrode 16b is provided on the peripheral portion 19.

The material forming the first excitation electrode 14a and the second excitation electrode 14b is not particularly limited, and for example, may be constituted by a chromium (Cr) layer on the side contacting the quartz crystal blank 11 as a base layer and a gold (Au) layer as a surface layer that is further from the quartz crystal blank 11 than the base layer. Adhesion between the quartz crystal blank and the excitation electrodes is improved by providing a metal layer having a high reactivity to oxygen as the base layer, and degradation of the excitation electrodes is suppressed and electrical reliability of the excitation electrodes is improved by providing a metal layer having low reactivity to oxygen as the surface layer.

As further shown, the cover member 20 has a substantially concave shape that opens toward a first main surface 32a of the base member 30. The cover member 20 is bonded to the base member 30, and as a result, the quartz crystal resonator 10 is accommodated in an inner space 26. The shape of the cover member 20 is not restricted so long as the quartz crystal resonator 10 can be accommodated, and for example, the cover member 20 may have a substantially rectangular shape when seen in plan view from a direction that is normal to a main surface of a top surface portion 21. The cover member 20, for example, has a long side direction in which long sides thereof that are parallel to the X axis direction extend, a short side direction in which short sides thereof that are parallel to the Z' axis direction extend, and a height direction that is parallel to the Y' axis direction.

As illustrated in FIG. 2, the cover member 20 has an inner surface 24 and an outer surface 25. The inner surface 24 is a surface on the inner space 26 side, and the outer surface 25 is a surface on the opposite side from the inner surface 24.

The cover member 20 has the top surface portion 21 that faces the first main surface 32a of the base member 30, and a side wall portion 22 that is connected to an outer edge of the top surface portion 21 and extends in a direction that intersects a main surface of the top surface portion 21. In addition, the cover member 20 has a facing surface 23, which faces the first main surface 32a of the base member 30, at an opening end portion (also referred to as an "opening end") of the concave shape thereof (i.e., an end portion on side of side wall portion 22 that is close to base member 30). In other words, the facing surface 23 is included in the opening end portion. The facing surface 23 extends in a substantially frame-like shape so as to surround the periphery of the quartz crystal resonator 10.

T1 represents the thickness of the top surface portion 21, T2 represents the thickness of the side wall portion 22, and T3 represents the thickness of the opening end portion. In the sectional view illustrated in FIG. 2 that is parallel to the XY' plane, the thickness T1 is a dimension of the top surface portion 21 in a direction that is parallel to the Y' axis direction, the thickness T2 is a dimension of the side wall portion 22 in a direction that is parallel to the X axis direction, and the thickness T3 is a dimension of the opening end portion in a direction that is parallel to the X axis direction. In this case, the thickness T1 is larger than the thickness T2 (T1>T2). In addition, the thickness T2 is equal to or less than the thickness T3 (T3≥T2). By making T1>T2, the side wall portion 22 deforms more easily than the top surface portion 21 and an external force acting on the side wall portion 22 can be dispersed through deformation of the side wall portion 22.

The top surface portion 21 and the side wall portion 22 are connected to each other by a connection portion 27. The connection portion 27 is formed such that the inner surface 24 and the outer surface 25 are curved in the connection portion 27, for example. In addition, the curvature of the inner surface 24 is substantially equal to the curvature of the outer surface 25 in the connection portion 27. The radius of curvature of the inner surface 24 and the outer surface 25 is set to fall within a range of 0.04-0.1 mm, for example. However, the connection portion 27 is not limited to having this shape, and for example, either of the inner surface 24 and the outer surface 25 may be a bent flat surface and the other may be a curved surface, or both the inner surface 24 and the outer surface 25 may be bent flat surfaces. However, in order to disperse an external force acting on the cover member 20 by using an arch structure, it is preferable that at least the outer surface 25 of the connection portion 27 is a curved surface. In addition, it should be appreciated that the inner surface 24 and the outer surface 25 are not limited to having the above-described combination of curvatures in the case where both the inner surface 24 and the outer surface 25 of the connection portion 27 are curved surfaces, and the inner surface 24 and the outer surface 25 may have different curvatures, for example, with the curvature of the inner surface 24 being larger than the curvature of the outer surface 25.

It is noted that the material of the cover member 20 is not particularly limited, and for example, the cover member 20 may be formed of a conductive material such as a metal. Therefore, a shielding function can be provided by electrically connecting the cover member 20 to the ground potential. For example, the cover member 20 is composed of an alloy that includes iron (Fe) and nickel (Ni) (for example, 42 alloy). In addition, a gold (Au) layer or the like may be provided in order to prevent oxidation and so forth of the outermost surface of the cover member 20. Alternatively, the cover member 20 may be formed of an insulating material, or may have a composite structure consisting of a conductive material and an insulating material.

The base member 30 supports the quartz crystal resonator 10 in such a manner that the quartz crystal resonator 10 can be excited. The base member 30 is substantially shaped like a flat plate. The base member 30 has a long side direction in which long sides thereof that are parallel to the X axis direction extend, a short side direction in which short sides thereof that are parallel to the Z' axis direction extend, and a thickness direction in which a thickness dimension thereof that is parallel to the Y' axis direction extends.

The base member 30 includes a base 31. The base 31 has the first main surface 32a (front surface) and a second main surface 32b (rear surface), which are opposite each other. The base 31 is a sintered material such as insulating ceramic (alumina). In this case, a plurality of insulating ceramic sheets may be stacked on top of one another and then sintered. Alternatively, the base 31 may be formed of an inorganic glass material (for example, silicate glass or a material having a material other than silicate as a main component and that exhibits a glass transition phenomenon upon being heated), a crystal material (for example, AT-cut crystal), an engineering plastic having heat resistance (for example, polyimide or a liquid crystal polymer), or an organic/inorganic hybrid material (for example, a fiber-strengthened plastic such as glass epoxy resin). The base 31 is preferably formed of a heat-resistant material. The base 31 may be made up of a single layer or a plurality of layers, and in the case where the base 31 is made up of a plurality of layers, the base 31 includes an insulating layer formed at the outermost layer constituting the first main surface 32a.

The base member 30 has electrode pads 33a and 33b provided on the first main surface 32a, and outer electrodes 35a, 35b, 35c and 35d provided on the second main surface 32b. The electrode pads 33a and 33b are terminals for electrically connecting the base member 30 and the quartz crystal resonator 10 to each other. In addition, the outer electrodes 35a, 35b, 35c and 35d are terminals for electrically connecting a circuit board, which is not illustrated, and the quartz crystal resonator unit 1 to each other. According to the exemplary aspect, the electrode pad 33a is electrically connected to the outer electrode 35a through a via electrode 34a that extends in the Y' axis direction, and the electrode pad 33b is electrically connected to the outer electrode 35b through a via electrode 34b that extends in the Y' axis direction. The via electrodes 34a and 34b are formed inside via holes that penetrate through the base 31 in the Y' axis direction.

Conductive holding members 36a and 36b electrically connect the pair of connection electrodes 16a and 16b of the quartz crystal resonator 10 to the pair of electrode pads 33a and 33b of the base member 30. In addition, the conductive holding members 36a and 36b hold the quartz crystal resonator 10 on the first main surface 32a of the base member 30 such that the quartz crystal resonator 10 can be excited. The conductive holding members 36a and 36b are formed of a conductive adhesive that includes a thermally curable resin or an ultraviolet light curable resin, for example.

In the example configuration illustrated in FIG. 1, the electrode pads 33a and 33b of the base member 30 are provided on the first main surface 32a in the vicinity of the short side of the base member 30 that is on negative direction side of the X axis, are spaced apart from the short side of the base member 30 and are arranged side by side in the short side direction. The electrode pad 33a is connected to the connection electrode 16a of the quartz crystal resonator 10 via the conductive holding member 36a, and the electrode pad 33b is connected to the connection electrode 16b of the quartz crystal resonator 10 via the conductive holding member 36b.

The plurality of outer electrodes 35a, 35b, 35c and 35d are provided in the vicinities of the respective corners of the second main surface 32b. In the example illustrated in FIG. 1, the outer electrodes 35a and 35b are arranged directly below the electrode pads 33a and 33b. As a result, the outer electrodes 35a and 35b are electrically connected to the electrode pads 33a and 33b by the via electrodes 34a and 34b that extend in the Y' axis direction. In the example illustrated in FIG. 1, among the four outer electrodes 35a to 35d, the outer electrodes 35a and 35b, which are arranged in the vicinity of the short side of the base member 30 on the negative direction side of the X axis are input/output electrodes to which input/output signals of the quartz crystal resonator 10 are supplied. In addition, according to the exemplary aspect, the outer electrodes 35c and 35d, which are arranged in the vicinity of the short side of the base member 30 on the positive direction side of the X axis, are dummy electrodes to which input/output signals of the quartz crystal resonator 10 are not supplied. Input/output signals of other electronic elements mounted on the circuit board, which is not illustrated, on which the quartz crystal resonator unit 1 is mounted are also not supplied to such dummy electrodes. Alternatively, the outer electrodes 35c and 35d may be ground electrodes to which the ground potential is supplied. In the case where the cover member 20 is composed of a conductive material, an electromagnetic shielding function realizing higher shielding performance than the cover member 20 can be added by connecting the cover member 20 to the outer electrodes 35c and 35d, which are ground electrodes.

Furthermore, a sealing frame 37 is provided on the first main surface 32a of the base 31. In the example illustrated in FIG. 1, the sealing frame 37 has a substantially rectangular frame-like shape when seen in plan view from a direction normal to the first main surface 32a. When seen in plan view from a direction normal to the first main surface 32a, the electrode pads 33a and 33b are arranged inside the sealing frame 37, and the sealing frame 37 is provided so as to surround the quartz crystal resonator 10. The sealing frame 37 is formed of a conductive material. A bonding member 40, which will be described later, is provided on the sealing frame 37, and as a result, the cover member 20 is bonded to the base member 30 with the bonding member 40 and the sealing frame 37 interposed therebetween.

In this example configuration, the electrode pads 33a and 33b, the outer electrodes 35a to 35d and the sealing frame 37 of the base member 30 are all formed of metal films. For example, the electrode pads 33a and 33b, the outer electrodes 35a to 35d and the sealing frame 37 are formed by stacking in order from the side close to the base 31 (lower layer) toward the side separated from the base 31 (upper layer) a molybdenum (Mo) layer, a nickel (Ni) layer and a gold (Au) layer. In addition, the via electrodes 34a and 34b can be formed by filling via holes formed in the base 31 with a metal material such as molybdenum (Mo).

The arrangement relationship between the electrode pads 33a and 33b and the outer electrodes 35a to 35d is not limited to the example described above. For example, the electrode pad 33a may be arranged in the vicinity of one short side of the base member 30, and the electrode pad 33b may be arranged in the vicinity of the other short side of the base member 30. In this configuration, the quartz crystal resonator 10 would be held on the base member 30 at both end portions of the quartz crystal blank 11 in the longitudinal direction of the quartz crystal blank 11.

Furthermore, the arrangement of the outer electrodes is not limited to the above-described example, and for example, the two outer electrodes serving as input/output electrodes may be provided at diagonally opposite corners of the second main surface 32b. Alternatively, rather than being arranged at the corners of the second main surface 32b, the four outer electrodes may instead be arranged in the vicinities of the centers of the sides of the second main surface 32b. In addition, the number of outer electrodes is not limited to four, and only two outer electrodes that serve as input/output electrodes may be provided, for example. Furthermore, the electrical connections between the connection electrodes and the outer electrodes are not limited to being realized by via electrodes, and these electrical connections may instead be realized by routing extension electrodes on the first main surface 32a or the second main surface 32b. Alternatively, the base 31 of the base member 30 may be formed of a plurality of layers, and the electrical connections between the connection electrodes and the outer electrodes may be realized by making the via electrodes extend to a center layer and routing the extension electrodes on the center layer.

According to the exemplary embodiment, the quartz crystal resonator 10 is sealed in the inner space (cavity) 26 enclosed by the cover member 20 and the base member 30 by bonding the cover member 20 and the base member 30 to each other with the sealing frame 37 and the bonding member 40 interposed therebetween. In this case, it is preferable that the inner space 26 be in a vacuum state has a lower pressure than atmospheric pressure. As a result of the inner space 26 being in a vacuum state, it is possible to reduce changes that occur over time in the frequency characteristics of the quartz crystal resonator unit 1 due to oxidation of the first excitation electrode 14a and the second excitation electrode 14b.

The bonding member 40 is provided along the entire peripheries of the cover member 20 and the base member 30. Specifically, the bonding member 40 is provided on the sealing frame 37. The sealing frame 37 and the bonding member 40 are interposed between the facing surface 23 of the side wall portion 22 of the cover member 20 and the first main surface 32a of the base member 30, and as a result, the quartz crystal resonator 10 is sealed by the cover member 20 and the base member 30.

The bonding member 40 is composed of a brazing material, for example. Specifically, the bonding member 40 is composed of a eutectic alloy of gold (Au) and tin (Sn). Thus, the cover member 20 and the base member 30 are metal bonded to each other. A sealing property can be improved through such metal bonding. The bonding member 40 is not limited to being formed of a conductive material, and may instead be formed of an insulating material such as a glass adhesive material like a low-melting-point glass (for example, lead-boric acid based or tin-phosphate based glass) or may be formed of a resin adhesive, for example. In this case, the cost would be lower than in the case of metal bonding, and it would be possible to lower the heating temperature and simplify the manufacturing process.

In the quartz crystal resonator 10 according to this embodiment, one end of the quartz crystal blank 11 in the long side direction (end portion on side where conductive holding members 36a and 36b are arranged) is a fixed end, and the other end of the quartz crystal blank 11 is a free end. In addition, the quartz crystal resonator 10, the cover member 20 and the base member 30 each have a substantially rectangular shape in the XZ' plane, and the long side directions and the short side directions thereof match each other.

However, the position of the fixed end of the quartz crystal resonator 10 is not particularly limited, and as is described later, the quartz crystal resonator 10 may be fixed to the base member 30 at both ends of the quartz crystal blank 11 in the long side direction. In this case, it would be sufficient for the electrodes of the quartz crystal resonator 10 and the base member 30 to be formed such that the quartz crystal resonator 10 is fixed in place at both ends of the quartz crystal blank 11 in the long side direction.

In the quartz crystal resonator unit 1 according to this embodiment, an alternating electric field is applied between the first excitation electrode 14a and the second excitation electrode 14b of the quartz crystal resonator 10 via the outer electrodes 35a and 35b of the base member 30. Thus, the quartz crystal blank 11 vibrates with a prescribed vibration mode such as the thickness shear vibration mode, and resonance characteristics are obtained along with the vibration.

Figure 3:
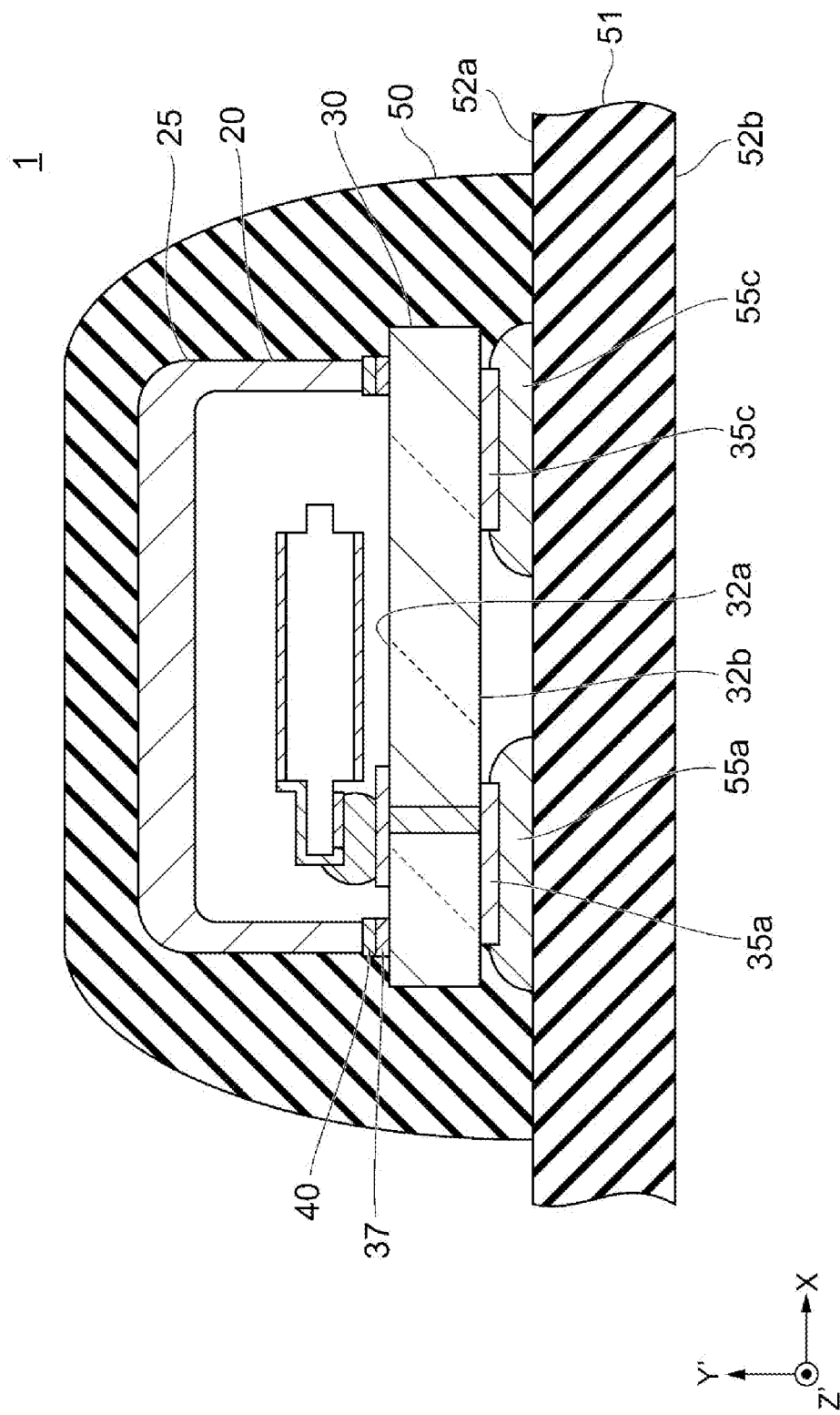
FIG. 3 is a sectional view illustrating the quartz crystal resonator unit mounted on a circuit board.

Next, a mounted state of the quartz crystal resonator unit 1 according to the exemplary embodiment will be described while referring to FIG. 3. In this case, FIG. 3 is a sectional view illustrating the quartz crystal resonator unit mounted on a circuit board. The sectional view includes the XY' cross section of the quartz crystal resonator unit 1 illustrated in FIG. 2. The module component illustrated in FIG. 3 includes the quartz crystal resonator unit 1 and a circuit board 51 on which at least the quartz crystal resonator unit 1 is mounted. The quartz crystal resonator unit 1 is covered by a sealing member 50 on the circuit board 51. Electronic components other than the quartz crystal resonator unit 1 such as semiconductor chips and chip capacitors may be mounted on the circuit board 51.

The circuit board 51 has a mounting front surface 52a and a mounting rear surface 52b, which are opposite each other, and the quartz crystal resonator unit 1 is mounted on the mounting front surface 52a of the circuit board 51. For example, solder members 55a and 55c electrically connect terminals on the mounting front surface 52a, which are not illustrated, and the outer electrodes 35a and 35c of the quartz crystal resonator unit 1 to each other, and fix the quartz crystal resonator unit 1 to the circuit board 51.

The quartz crystal resonator unit 1 is covered by the sealing member 50. The sealing member 50 is provided on the outer surface 25 of the cover member 20, the base member 30 and the mounting front surface 52a of the circuit board 51, and increases the adhesion between the quartz crystal resonator unit 1 and the circuit board 51. Thus, the sealing member 50 protects the quartz crystal resonator unit 1 from impacts, and suppresses damage to the quartz crystal resonator unit 1 and helps to prevent the quartz crystal resonator unit 1 from peeling off the circuit board 51.

The sealing member 50 is formed of an insulating resin material such as a thermally curable resin or an ultraviolet light curable resin. In other words, the process of mounting the quartz crystal resonator unit 1 includes a step of fixing the quartz crystal resonator unit 1 to the circuit board 51 using the solder members 55a and 55c, a step of arranging the uncured sealing member 50 so as to cover the quartz crystal resonator unit 1 by, for example, applying or dropping the material of the uncured sealing member 50, and a step of curing the sealing member 50. The sealing member 50 contracts and causes the cover member 20 to deform upon being cured. Therefore, tensile stress acts on the bonding member 40.

Figure 4:
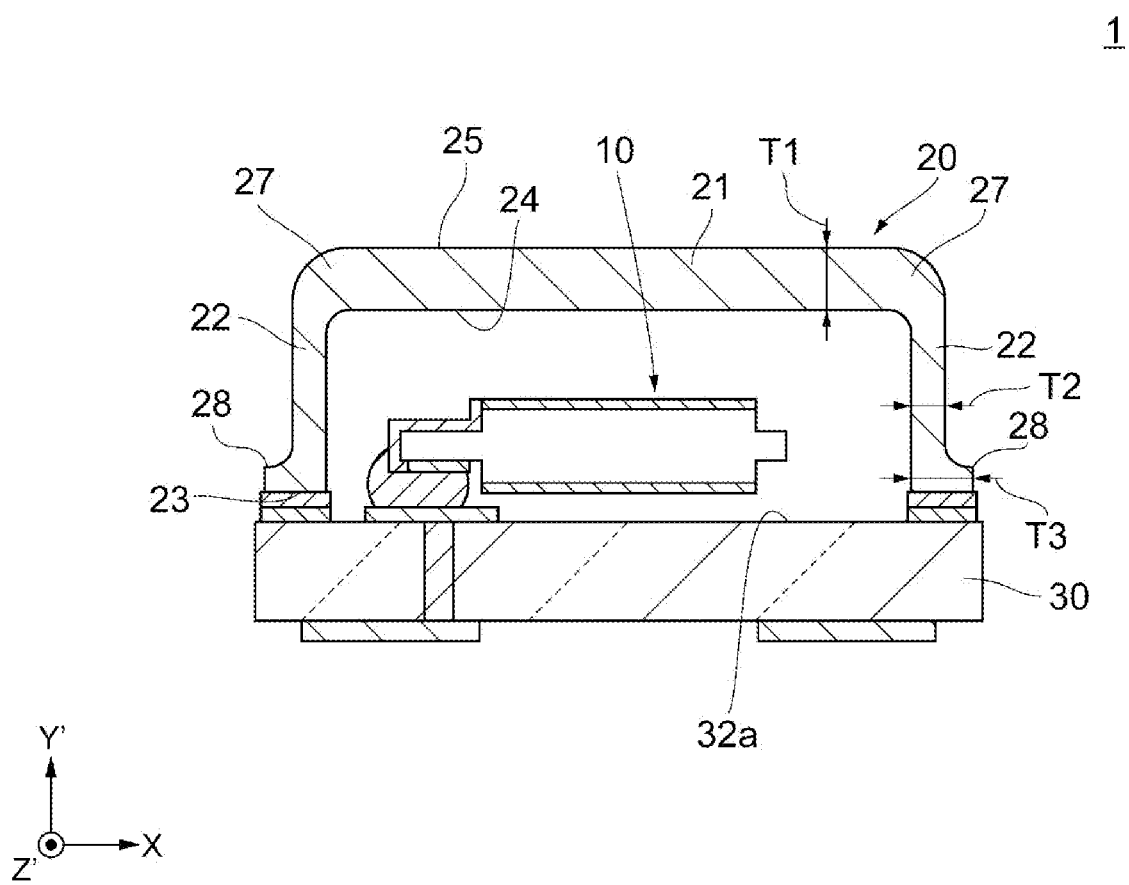
FIG. 4 is a sectional view illustrating a modification of the exemplary quartz crystal resonator unit.

A refinement of the exemplary embodiment of the quartz crystal resonator unit according to the present disclosure will be described while referring to FIG. 4. FIG. 4 is a sectional view illustrating the modification of the quartz crystal resonator unit. This modification differs from the example configuration of the above-described embodiment in that the opening end portion of the cover member 20 includes a flange portion 28 or flange (the terms are used interchangeably).

As shown, the flange portion 28 is provided on the side of the side wall portion 22 that is close to the base member 30. The flange portion 28 is superposed with the side wall portion 22 and is also located outside the side wall portion 22 when seen in plan view from a direction normal to a main surface of the top surface portion 21. In this exemplary the thickness T3 is the combined thickness of the side wall portion 22 and the flange extending in (i.e., parallel to) the X axis direction. Thus, when T3 represents the thickness of the flange portion 28 (dimension in direction parallel to X axis direction), the thickness T3 is larger than the thickness T2 of the side wall portion 22 (T2<T3) according to the exemplary aspect. In the illustrated example, the side wall portion 22 and the flange portion 28 are connected to each other such that the outer surface 25 forms a curved surface. In addition, the side wall portion 22 and the flange portion 28 are connected to each other in a continuous manner without the inner surface 24 being curved. In this exemplary aspect, the surface area of the facing surface 23 is larger than in the example configuration illustrated in FIG. 2. Therefore, the bonding strength between the base member 30 and the cover member 20 can be improved.

Figure 5:
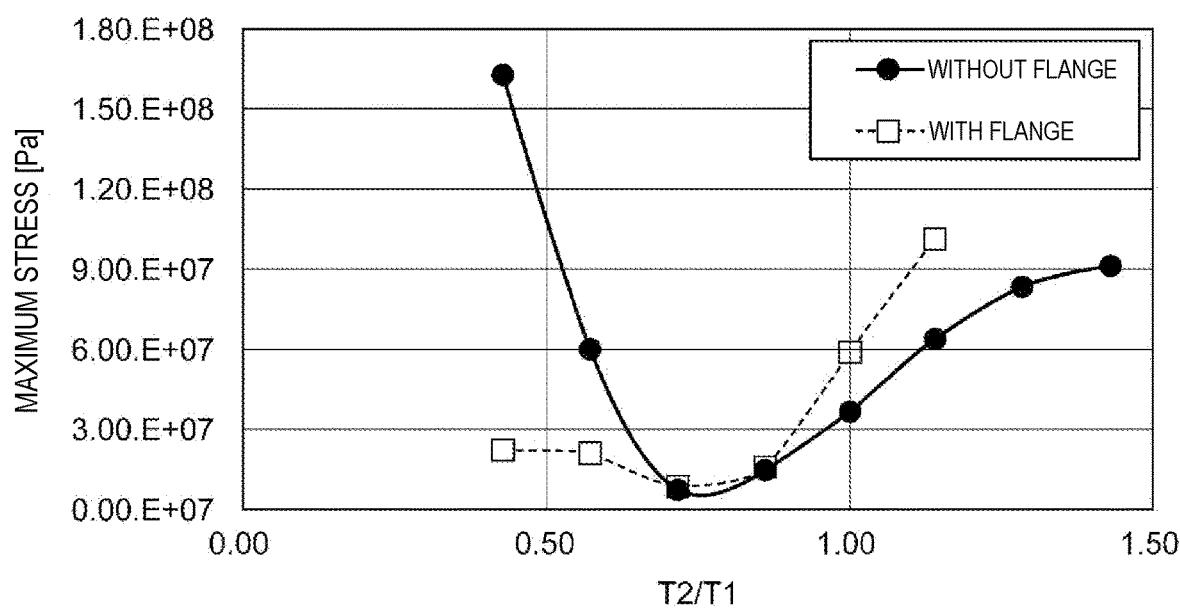
FIG. 5 illustrates the relationship between a thickness ratio of the cover member and tensile stress acting on a bonding portion when the quartz crystal resonator unit is covered by a sealing member.

Next, results obtained by simulating the stress that acts on the bonding member 40 when the quartz crystal resonator unit 1 is covered by the sealing member 50 will be described while referring to FIG. 5. In this case, FIG. 5 illustrates the relationship between a thickness ratio of the cover member and stress acting on a bonding portion when the quartz crystal resonator unit is covered by the sealing member. The vertical axis represents the maximum stress out of stress acting on the bonding portion (sealing frame 37 and bonding member 40), and the horizontal axis represents the thickness ratio between the side wall portion 22 and the top surface portion 21 (T2/T1). The round marks represent the simulation results obtained for the example configuration illustrated in FIG. 2 in which there is no flange portion, and the square marks represent the simulation results obtained for the modification illustrated in FIG. 4 in which there is a flange portion. The occurrence of a leak caused by a crack in the bonding portion can be suppressed to a greater degree the smaller the maximum stress along the vertical axis becomes. Table 1 below illustrates simulation results of maximum stress with respect to the thickness ratio, and the graph of FIG. 5 was drawn by plotting the numerical values illustrated in Table 1.

TABLE 1

| Thickness of Side Wall Portion (mm) | Thickness Ratio T2/T1 | Maximum Stress (Pa) | |
|---|---|---|---|
| | | Without Flange | With Flange |
| 0.03 | 0.43 | $1.63 \times 10^8$ | $2.18 \times 10^7$ |
| 0.04 | 0.57 | $6.08 \times 10^7$ | $2.09 \times 10^7$ |
| 0.05 | 0.71 | $6.66 \times 10^6$ | $8.86 \times 10^6$ |
| 0.06 | 0.86 | $1.47 \times 10^7$ | $1.57 \times 10^7$ |
| 0.07 | 1.00 | $3.71 \times 10^7$ | $5.88 \times 10^7$ |
| 0.08 | 1.14 | $6.38 \times 10^7$ | $1.02 \times 10^8$ |
| 0.09 | 1.29 | $8.34 \times 10^7$ | |
| 1 | 1.43 | $9.10 \times 10^7$ | |

The maximum stress has a minimum value in the range 0.5<T2/T1<0.9 regardless of the presence or absence of the flange portion. In addition, deformation of the side wall portion 22 is large in the range T2/T1≤0.5, and there is a risk that the cover member will contact the quartz crystal resonator unit. Therefore, the desired range of the thickness ratio in order to reduce the risk of cracks occurring in the bonding portion is around 0.5<T2/T1<0.9. In addition, since the maximum stress is minimum when T2/T1 is around 0.7-0.8, it is more preferable that the T2/T1 be around 0.7-0.8.

In the configuration where there is no flange portion, the maximum stress decreases in the range 0.65<T2/T1<1.0 compared with when 1.0≤T2/T1. In addition, the maximum stress is a smallest when T2/T1=0.75, and the maximum stress increases at values of the thickness ratio larger and smaller than T2/T1=0.75. For example, the maximum stress sufficiently decreases in the range 0.65<T2/T1<0.9 compared with when T2/T1=1.0.

In the example illustrated in FIG. 5, the maximum stress is $3.0 \times 10^7$ or less in the range 0.65<T2/T1<0.9, and this is around 80% or less the value of $3.71 \times 10^7$ that occurs when T2/T1=1.0. In the range T2/T1<0.65, the maximum stress is larger than that when T2/T1=1.0, and the maximum stress increases as the thickness ratio further decreases. In addition, in the range 0.7<T2/T1<0.85, the maximum stress is smaller in the case of the configuration without a flange portion than in the case of the configuration with a flange portion. In other words, in the range 0.7<T2/T1<0.85, the configuration without a flange portion has an advantage over the configuration with a flange portion in terms of the maximum stress acting on the bonding portion.

In the configuration where there is a flange portion, the maximum stress decreases in the range T2/T1<1.0 compared with when 1.0≤T2/T1. In addition, the maximum stress is a smallest when T2/T1=0.75, and the maximum stress increases at values of the thickness ratio larger and smaller than T2/T1=0.75. For example, the maximum stress sufficiently decreases in the range 0.5<T2/T1<0.85 compared with when T2/T1=1.0. In the example illustrated in FIG. 5, the maximum stress is $3.0 \times 10^7$ or less in the range 0.5<T2/T1<0.85, and this is around 50% or less the value of $5.88 \times 10^7$ that occurs when T2/T1=1.0. In addition, in the range 0.5<T2/T1<0.7, the maximum stress is smaller in the case of the configuration with a flange portion than in the case of the configuration without a flange portion. In other words, in the range 0.5<T2/T1<0.7, the configuration with a flange portion has an advantage over the configuration without a flange portion in terms of the maximum stress acting on the bonding portion.

Figure 6:
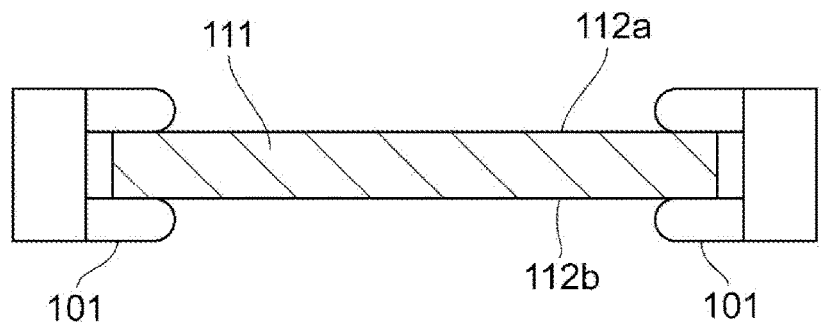
FIG. 6 illustrates a step of fixing a metal member in place using a jig.
Figure 7:
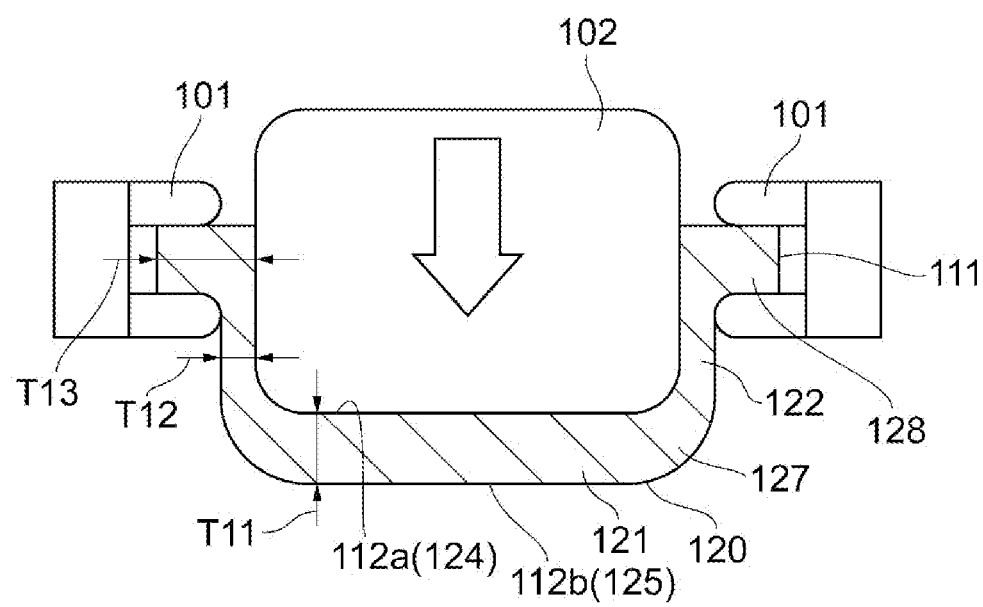
FIG. 7 illustrates a step of changing the shape of a metal member by subjecting the metal member to press working.
Figure 8:
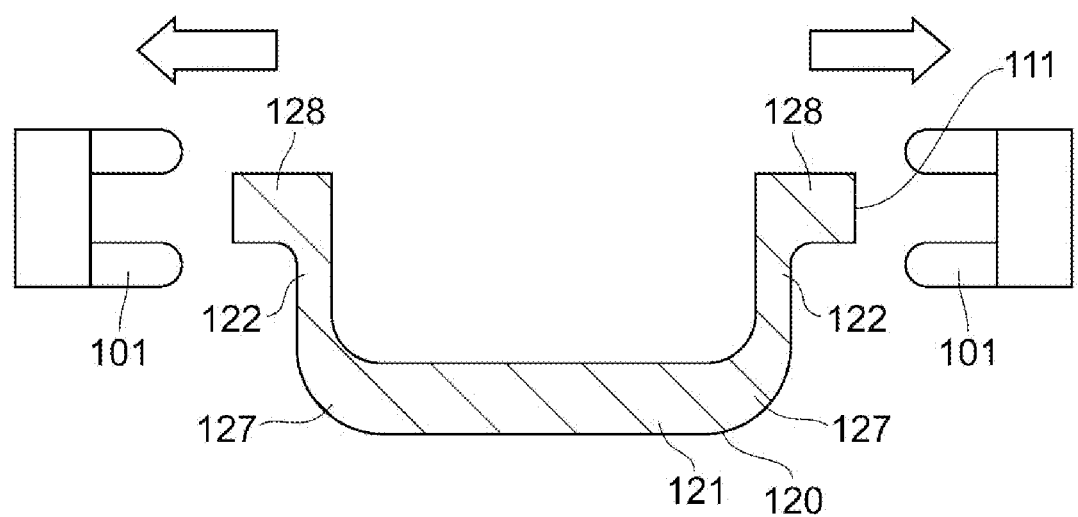
FIG. 8 illustrates a step of obtaining a molded cover member.

Next, a method of manufacturing a piezoelectric resonator unit according to an exemplary embodiment of the present disclosure will be described while referring to FIGS. 6 to 8. The step of manufacturing a cover member is described here, and since the descriptions relating to FIGS. 1 to 3 can be referred to above for the other steps such as a step of mounting a piezoelectric resonator on a base member, a step of accommodating the piezoelectric resonator in an inner space formed by a cover member on the base member, and a step of providing a sealing member by curing resin so as to cover the cover member, the description of these steps is omitted here. FIG. 6 illustrates a step of fixing a metal member in place using a jig. FIG. 7 illustrates a step of changing the shape of the metal member by subjecting the metal member to pressing. FIG. 8 illustrates a step of obtaining a molded cover member.

First, a substantially flat-plate-shaped metal member 111 is fixed in place using a jig 101 (FIG. 6). The jig 101 is set so as to pinch an end portion of the metal member 111 such that the center portions of two main surface 112*a* and 112*b* of the metal member 111 are exposed.

Next, the center portion of the metal member 111 is pressed by a mold 102 (FIG. 7). At this time, the shape of the metal member 111 is changed such that the main surface 112*a* becomes concave and the main surface 112*b* becomes convex. As a result, the metal member 111 becomes a cover member 120, the main surface 112*a* becomes an inner surface 124 and the main surface 112*b* becomes an outer surface 125. The part of the metal member 111 that is pinched by the jig 101 becomes a flange portion 128, the part of the metal member 111 that is pressed by the mold 102 becomes a top surface portion 121, and the part of the metal member 111 located between the jig 101 and the mold 102 becomes a side wall portion 122. In addition, the part of the metal member 111 that contacts a corner of the mold 102 becomes a connection portion 127 between the top surface portion 121 and the side wall portion 122. Since the inner surface 124 is formed by the shape of the mold 102 being transferred to the main surface 112*a*, processing can be performed such that the inner surface 124 of the connection portion 127 becomes a curved surface by using a mold 102 having round corners.

T11 represents the thickness of the top surface portion 121, T12 represents the thickness of the side wall portion 122, and T13 represents the thickness of the flange portion 128. The side wall portion 122 is formed by the metal member 111 being stretched, and therefore the thickness T12 of the side wall portion 122 is smaller than the thickness T11 of the top surface portion 121. The thicknesses T11, T12 and T13 can be adjusted by changing the processing conditions. The press working conditions include the temperature of the metal member 111, the pressing speed of the mold 102, the distance between the jig 101 and the mold 102, and so forth.

Next, the cover member 120 is obtained by removing the mold 102 and the jig 101 (FIG. 8).

As described above, according to this embodiment, a piezoelectric resonator unit 1 is provided that includes the base member 30; a piezoelectric resonator 10 that is mounted on the base member 30; and the cover member 20 that is bonded to the base member 30 and that forms, together with base member 30, the inner space 26 that accommodates the piezoelectric resonator 10. As further described above, the cover member 20 includes the top surface portion 21 that faces the base member 30 with the piezoelectric resonator 10 interposed therebetween, and the side wall portion 22 that extends in a direction that intersects a main surface of the top surface portion 21. The thickness T1 of the top surface portion 21 is larger than the thickness T2 of the side wall portion 22.

According to the above-described embodiment, the stress acting on a bonding portion between the base member and the cover member when an external force acts on the cover member can be reduced through deformation of the side wall portion of the cover member. Thus, air-tightness of the inner space can be maintained and variations in the frequency of the piezoelectric resonator unit can be suppressed as a result of the occurrence of cracks in the bonding portion being suppressed.

In addition, electronic components such as the piezoelectric resonator unit, a semiconductor chip, a chip capacitor and so forth are mounted on the circuit board. Next, a sealing member, the fluidity of which has been increased by being heated, is supplied to the circuit board so as to cover the electronic components such as the piezoelectric resonator unit. Next, the sealing member is cured by being cooled. A module component can be obtained in which at least the piezoelectric resonator unit is mounted on the circuit board and in which electronic components including the piezoelectric resonator unit mounted on the circuit board are covered by the sealing member by performing this manufacturing step.

When T1 represents the thickness of the top surface portion 21 and T2 represents the thickness of the side wall portion 22, $0.5 < T2/T1 < 0.9$ may be satisfied according to an exemplary aspect. As a result, the thickness ratio falls within the range in which the maximum value of the stress acting on the bonding portion between the cover member and the base member (maximum stress) can take the minimum value, and therefore, the generation of cracks in the bonding portion can be suppressed.

Moreover, $0.65 < T2/T1 < 0.9$ may be satisfied according to an exemplary aspect. Thus, the maximum stress can be sufficiently reduced compared with the maximum stress in the bonding portion in the case where $1 \leq T2/T1$.

Yet further, $0.7 < T2/T1 < 0.85$ may be satisfied according to an exemplary aspect. In this case, the maximum stress in the bonding portion can be reduced compared with the configuration in which the opening end portion is a flange portion.

The cover member 20 has the flange portion 28 that is located outside the top surface portion 21 when seen in plan view from a direction normal to a main surface of the top surface portion 21, and that is connected to the side wall portion 22, and the cover member 20 may satisfy $0.5 < T2/T1 < 0.85$. In this case, the facing surface that faces the bonding portion can be made wider, and the bonding strength can be improved. In addition, the maximum stress can be sufficiently reduced compared with the maximum stress in the bonding portion in the case where $1 \leq T2/T1$.

The cover member 20 may have the flange portion 28, and in addition, may satisfy $0.5 < T2/T1 < 0.7$ according to an exemplary aspect. In this case, the maximum stress in the bonding portion can be reduced compared with the configuration that does not include the flange portion. Furthermore, the maximum stress can be made ½ or less that in the case where $1 \leq T2/T1$.

The cover member 20 may include the connection portion 27 that connects the top surface portion 21 and the side wall portion 22 to each other, and at least the outer surface 25 of the connection portion 27 may be a curved surface. In this case, an external force acting on the outer surface of the cover member can be dispersed.

In one aspect, he curvature of the inner surface 24 may be larger than the curvature of the outer surface 25 in the connection portion 27. In this case, the inner space formed by the base member and the cover member can be made wider, and the risk of contact occurring between the cover member and the piezoelectric resonator can be reduced. In addition, the size of the piezoelectric resonator unit can be reduced.

Alternatively, the inner surface 24 and the outer surface 25 of the connection portion 27 may have substantially the same curvature. In this case, an external force acting on the outer surface of the cover member can be dispersed. In addition, a situation in which stress becomes concentrated in one part of the connection portion can be suppressed by making the thickness of the connection portion uniform.

The outer surface 25 of the connection portion between the side wall portion 22 and the flange portion 28 may be a curved surface. In this case, an external force acting on the outer surface of the cover member can be dispersed.

Moreover, the piezoelectric resonator unit 1 may be covered by the resin sealing member 50. In this case, although stress acts on the cover member due to the sealing member contracting when the sealing member is cured, the occurrence of cracks in the bonding portion can be suppressed when the contraction occurs due to curing due to the exemplary designs described herein.

In addition, according to another mode of this embodiment, a method of manufacturing the piezoelectric resonator unit 1 is provided that includes providing the cover member 120 having the top surface portion 121 and the side wall portion 122 that extends in a direction that intersects a main surface of the top surface portion 121 by press working the substantially flat plate shaped metal member 111; mounting the piezoelectric resonator 10 on the base member 30; and bonding the cover member 120 (20) to the base member 30 and accommodating the piezoelectric resonator 10 in the inner space 26 formed by the base member 30 and the cover member 20. In this aspect, the thickness of the top surface portion 121 is larger than the thickness of the side wall portion 122.

According to the above-described exemplary aspect, the stress acting on the bonding portion between the base member and the cover member when an external force acts on the cover member can be reduced through deformation of the side wall portion of the cover member. Thus, airtightness of the inner space can be maintained and variations in the frequency of the piezoelectric resonator unit can be suppressed as a result of the occurrence of cracks in the bonding portion being suppressed.

As described above, according to exemplary embodiments of the present disclosure, a piezoelectric resonator unit that can suppress variations in frequency, and a method of manufacturing the same can be provided.

In general, it is noted that the exemplary embodiments described above are provided to enable understanding of the present disclosure and the embodiments are not to be interpreted as limiting the present invention. The present invention can be modified or improved without departing from the gist of the invention and equivalents to the present invention are also included in the scope of the present invention. In other words, appropriate design changes made to the embodiments by one skilled in the art are included in the scope of the present invention so long as the changes have the characteristics of the present invention. For example, the elements included in the embodiments and the arrangements, materials, conditions, shapes, sizes and so forth of the elements are not limited to those exemplified in the embodiments and can be appropriately changed. In addition, the elements included in the embodiments can be combined as much as technically possible and such combined elements are also included in the scope of the present invention so long as the combined elements have the characteristics of the present invention.

While preferred embodiments of the invention have been described above, it is to be understood that variations and modifications will be apparent to those skilled in the art without departing from the scope and spirit of the invention.

What is claimed:

1. A piezoelectric resonator unit comprising:
a base;
a piezoelectric resonator disposed on the base; and
a cover bonded to the base to form a space between the cover and the base that accommodates the piezoelectric resonator, the cover including a top surface that faces a main surface of the base with the piezoelectric resonator interposed therebetween, and at least one side wall that extends from the top surface of the cover in a direction towards the base,
wherein the top surface has a first thickness that is larger than a second thickness of the at least one side wall, and
where T1 represents the first thickness of the top surface and T2 represents the second thickness of the at least one side wall, with $0.5 < T2/T1 < 0.9$.

2. The piezoelectric resonator unit according to claim 1, wherein $0.65 < T2/T1 < 0.9$.

3. The piezoelectric resonator unit according to claim 2, wherein $0.7 < T2/T1 < 0.85$.

4. The piezoelectric resonator unit according to claim 1, wherein the cover includes a flange that extends outward from the at least one side wall such that the flange is outside the top surface when seen in a plan view from a direction normal to a main surface of the top surface.

5. The piezoelectric resonator unit according to claim 4, wherein $0.5 < T2/T1 < 0.85$.

6. The piezoelectric resonator unit according to claim 5, wherein $0.5 < T2/T1 < 0.7$.

7. The piezoelectric resonator unit according to claim 1,
wherein the cover includes a connection portion that connects the top surface and the at least one side wall to each other, and
wherein at least an outer surface of the connection portion is curved.

8. The piezoelectric resonator unit according to claim 7, wherein a curvature of an inner surface of the connection portion is larger than a curvature of the outer surface of the connection portion.

9. The piezoelectric resonator unit according to claim 7, wherein a curvature of an inner surface of the connection portion and a curvature of the outer surface of the connection portion are substantially equal to each other.

10. The piezoelectric resonator unit according to claim 4, wherein the at least one side wall and the flange are connected to each other by a curved surface.

11. The piezoelectric resonator unit according to claim 1, wherein the piezoelectric resonator unit is covered by a sealing member.

12. The piezoelectric resonator unit according to claim 1, wherein the at least one side wall is configured to deform more easily than the top surface based on the first thickness of the top surface being greater than the second thickness of the side surface.

13. The piezoelectric resonator unit according to claim 4, wherein a combined thickness of the flange and the at least one side wall in direction parallel to the main surface of the base is greater than the second thickness of the at least one side wall.

14. The piezoelectric resonator unit according to claim 1, further comprising:
a sealing frame disposed on the main surface of the base; and a bonding member disposed on the sealing frame, such that the bonding member and the sealing frame collectively bond the cover to the base.

15. A module component comprising:

a piezoelectric resonator unit including:
- a base;
- a piezoelectric resonator disposed on the base; and
- a cover bonded to the base to form a space between the cover and the base that accommodates the piezoelectric resonator, wherein the cover includes a top surface that faces a main surface of the base with the piezoelectric resonator interposed therebetween, and at least one side wall that extends from the top surface of the cover in a direction towards the base,
- wherein the top surface has a first thickness that is larger than a second thickness of the at least one wall surface, and
- where T1 represents the first thickness of the top surface and T2 represents the second thickness of the at least one side wall, with $0.5 < T2/T1 < 0.9$;

a circuit board; and a sealing member, wherein the piezoelectric resonator unit is mounted on the circuit board, and the sealing member is disposed on the circuit board to cover the piezoelectric resonator unit.

16. The module component according to claim 15, wherein the cover includes a flange that extends outward from the at least one side wall, such that the flange is outside the top surface when seen in a plan view from a direction normal to a main surface of the top surface.

\* \* \* \* \*